(12) United States Patent
Stone (10) Patent No.: US 8,693,210 B2
(45) Date of Patent: Apr. 8, 2014

(54) PRODUCT PACKAGING (75) Inventor: Kate Stone, Cambridgeshire (GB)

(73) Assignee: Novalia Ltd., Cambridgeshire (GB)

( * ) Notice: Subject to any disclaimer, the term of this patent is extended or adjusted under 35 U.S.C. 154(b) by 141 days.

(21) Appl. No.: 12/738,167

(22) PCT Filed: Oct. 17, 2008

(86) PCT No.: PCT/GB2008/050949
§ 371 (c)(1),
(2), (4) Date: Jul. 16, 2010

(87) PCT Pub. No.: WO2009/050515
PCT Pub. Date: Apr. 23, 2009

(65) Prior Publication Data
US 2012/0092844 A1    Apr. 19, 2012

(30) Foreign Application Priority Data
Oct. 18, 2007   (GB) .................................. 0720391.2

(51) Int. Cl.
H05K 7/12    (2006.01)

(52) U.S. Cl.
USPC ............. 361/771; 361/56; 361/720; 361/748; 174/252; 174/260; 257/734; 257/783; 438/107

(58) Field of Classification Search
USPC ............ 361/771, 56, 720, 748; 174/252, 260; 257/734, 783; 438/107
See application file for complete search history.

(56) References Cited

U.S. PATENT DOCUMENTS

| | | | | |
|---|---|---|---|---|
| 3,480,836 A | * | 11/1969 | Aronstein | 361/720 |
| 4,322,777 A | * | 3/1982 | Ueta et al. | 361/748 |
| 4,419,663 A | * | 12/1983 | Kohashi | 345/107 |
| 5,080,470 A | * | 1/1992 | Warszawski | 359/265 |
| 5,148,355 A | * | 9/1992 | Lowe et al. | 361/778 |
| 5,539,379 A | * | 7/1996 | MacPherson | 340/550 |
| 5,782,186 A | * | 7/1998 | McTaggart | 104/60 |
| 5,933,307 A | * | 8/1999 | West | 361/56 |
| 6,097,610 A | * | 8/2000 | Hashimoto | 361/760 |
| 6,143,991 A | * | 11/2000 | Moriyama | 174/261 |
| 6,160,714 A | * | 12/2000 | Green | 361/761 |

(Continued)

FOREIGN PATENT DOCUMENTS

DE    102004005370 A1    9/2005
EP         0790758 A1    8/1997

(Continued)

OTHER PUBLICATIONS

International Preliminary Report on Patentability issued in International Application No. PCT/GB2008/050949 dated Apr. 20, 2010.

(Continued)

Primary Examiner — Xiaoliang Chen
(74) Attorney, Agent, or Firm — McCarter & English, LLP

(57) ABSTRACT

A method of fabricating packaging for a product comprises forming a plurality of conductive tracks on a sheet of material and forming a physical barrier, such as a hole, for impeding fluid flow between adjacent conductive tracks. The method may further comprise depositing first and second regions conductive fluid onto adjacent first and second conductive tracks either side of the physical barrier and mounting an electronic device having first and second terminals such that the electronic device forms a bridge over the physical barrier and the first ands second terminals contact the first and second conductive adjacent tracks.

9 Claims, 5 Drawing Sheets (56) References Cited

U.S. PATENT DOCUMENTS

| | | | |
|---|---|---|---|
| 6,175,151 B1* | 1/2001 | Hashimoto | 257/676 |
| 6,229,442 B1* | 5/2001 | Rolin et al. | 340/572.1 |
| 6,410,977 B1* | 6/2002 | Hashimoto | 257/673 |
| 6,428,671 B1* | 8/2002 | Sogo et al. | 204/623 |
| 6,519,161 B1* | 2/2003 | Green | 174/394 |
| 2002/0011786 A1* | 1/2002 | Murasko et al. | 313/518 |
| 2002/0068424 A1* | 6/2002 | Hashimoto | 438/612 |
| 2002/0166685 A1 | 11/2002 | Miyamura et al. | |
| 2004/0060162 A1* | 4/2004 | Moren | 29/601 |
| 2004/0103808 A1* | 6/2004 | Lochun et al. | 101/483 |
| 2005/0056458 A1 | 3/2005 | Sugiura | |
| 2005/0214963 A1* | 9/2005 | Daniels et al. | 438/29 |
| 2005/0253987 A1* | 11/2005 | Stephenson et al. | 349/113 |
| 2005/0274541 A1 | 12/2005 | Takahashi | |
| 2006/0159899 A1* | 7/2006 | Edwards et al. | 428/209 |
| 2006/0249832 A1* | 11/2006 | Hashimoto | 257/690 |
| 2006/0260493 A1* | 11/2006 | Travis et al. | 101/491 |
| 2007/0090387 A1* | 4/2007 | Daniels et al. | 257/99 |
| 2007/0144045 A1* | 6/2007 | Anderson et al. | 40/544 |
| 2007/0284759 A1* | 12/2007 | Suguro et al. | 257/783 |
| 2008/0129803 A1* | 6/2008 | McCabe et al. | 347/86 |
| 2009/0326493 A1* | 12/2009 | Wada et al. | 604/361 |

FOREIGN PATENT DOCUMENTS

| | | |
|---|---|---|
| JP | 07283493 | 10/1995 |
| JP | 2005150652 A | 9/2005 |
| WO | WO2009050515 A1 | 4/2009 |

OTHER PUBLICATIONS

International Search Report for Application No. PCT/GB2008/050949, dated Feb. 4, 2009.
Written Opinion for Application No. PCT/GB2008/050949, dated Feb. 4, 2009.
Search Report for Application No. GB0720391.2, dated Feb. 7, 2008.
Examination Report, dated Dec. 2, 2013, issued in EP Application No. 08 806 763.2, 6 pages.

* cited by examiner

PRODUCT PACKAGING

RELATED APPLICATIONS

This application is a 35 U.S.C. §371 national stage filing of International Application No. PCT/GB2008/050949, filed Oct. 17, 2008, which is related and claims priority to GB 0720391.2, filed Oct. 18, 2007. The entire contents of these applications are explicitly incorporated herein by reference.

FIELD OF THE INVENTION

The present invention relates to product packaging and/or printed matter.

SUMMARY

According to the present invention there is provided a method of fabricating packaging for a product and/or printed mater, the method comprising forming a plurality of conductive tracks on a sheet of material and forming a physical barrier for impeding fluid flow between adjacent conductive tracks.

Thus, the physical barrier can help to prevent, during a subsequent step, conductive fluid from forming a short between the conductive tracks for example by preventing the two regions from being smudged into each other or being drawn together by capillary action.

Forming the physical barrier may comprise removing a portion of the substrate.

Removing the portion of the substrate may comprise forming a hole through the sheet, for example punching the hole. Forming the physical barrier may comprise forming a trench in the sheet, for instance by impressing a stamp into a surface of the sheet supporting the conducting tracks. Forming the physical barrier may comprise forming a wall upstanding from the sheet, for example by impressing a stamp into a surface which is reverse to a surface supporting the conducting tracks.

The barrier may be elongate having a longitudinal axis which is transverse to a shortest line between adjacent tracks.

Forming the plurality of conductive tracks on a sheet of material may include forming at least one conductive track and breaking at least one conductive track into more conductive tracks. Forming the physical barrier may break the at least one conductive track into the more conductive tracks.

The method may comprise printing ink onto the sheet of material to form text and/or image(s) and may comprise printing multiple inks to form colour text and/or image(s).

The method may comprise cutting the sheet into smaller sections and may comprise folding the sheet or a section of the sheet to form an enclosure.

The method may comprise depositing first and second regions conductive fluid onto first and second conductive adjacent tracks either side of the physical barrier; and mounting an electronic device having first and second terminals such that the electronic device forms a bridge over the physical barrier and the first and second terminals contact the first and second conductive adjacent tracks.

According to a second aspect of the present invention there is provided a method of fabricating packaging for a product and/or printed mater, the method comprising providing a printed sheet comprising a plurality of conductive tracks disposed on a sheet of material and having a physical barrier for impeding fluid flow between adjacent conductive tracks, depositing first and second regions conductive fluid onto first and second conductive adjacent tracks either side of the physical barrier; and mounting an electronic device having first and second terminals such that the electronic device forms a bridge over the physical barrier and the first and second terminals contact the first and second conductive adjacent tracks.

According to a third aspect of the present invention there is provided a printed sheet for packaging a product and/or for use as printed mater comprising a sheet of material, a plurality of conductive tracks supported on sheet of material and a physical barrier for impeding fluid flow arranged between adjacent conductive tracks.

The barrier may comprise a trench in the sheet, a hole through the sheet and/or a wall upstanding from the sheet. The barrier may be elongate and has longitudinal axis which is transverse to a shortest line between adjacent tracks.

The sheet material may comprise a packaging material or print medium and may comprise cardboard or a plastic.

According to a fourth aspect of the present invention there is provided an assembly comprising a printed sheet, first and second regions of conductive glue arranged on first and second conductive adjacent tracks either side of the physical barrier and an electronic device having first and second terminals such that the electronic device forms a bridge over the physical barrier and the first ands second terminals contact the first and second conductive adjacent tracks.

The conductive glue may be fluid. The electronic device may be a light emitting diode or a circuit board assembly.

The assembly may be configured as packaging for a product and/or as printed matter.

According to a fifth aspect of the present invention there is provided apparatus for fabricating packaging for a product and/or printed mater comprising means for forming a plurality of conductive tracks on a sheet of material and means for forming a physical barrier for impeding fluid flow, said means configured to form said physical barrier between adjacent conductive tracks.

According to a sixth aspect of the present invention there is provided apparatus comprising a printer configured to form conductive tracks on a sheet of material; and a press configured to form a physical barrier for impeding fluid flow, said press configured to form said physical barrier between adjacent conductive tracks.

The press may be configured to punch a hole in the sheet to form the physical barrier.

According to a seventh aspect of the present invention there is provided apparatus for fabricating packaging for a product and/or printed mater comprising means for providing a printed sheet comprising a plurality of conductive tracks disposed on a sheet of material and having a physical barrier for impeding fluid flow between adjacent conductive tracks, means for depositing first and second regions conductive fluid onto first and second conductive adjacent tracks either side of the physical barrier and means for mounting an electronic device having first and second terminals such that the electronic device forms a bridge over the physical barrier and the first ands second terminals contact the first and second conductive adjacent tracks.

BRIEF DESCRIPTION OF THE DRAWINGS

Embodiments of the present invention will now be described by way of example, with reference to the accompanying drawings in which.

DETAILED DESCRIPTION

A problem can arise when conductive glue, for example in the form of metallic particles suspended in a carrier, is used to attach electronic devices, such as light emitting diodes, to conductive tracks.

Figure 1:
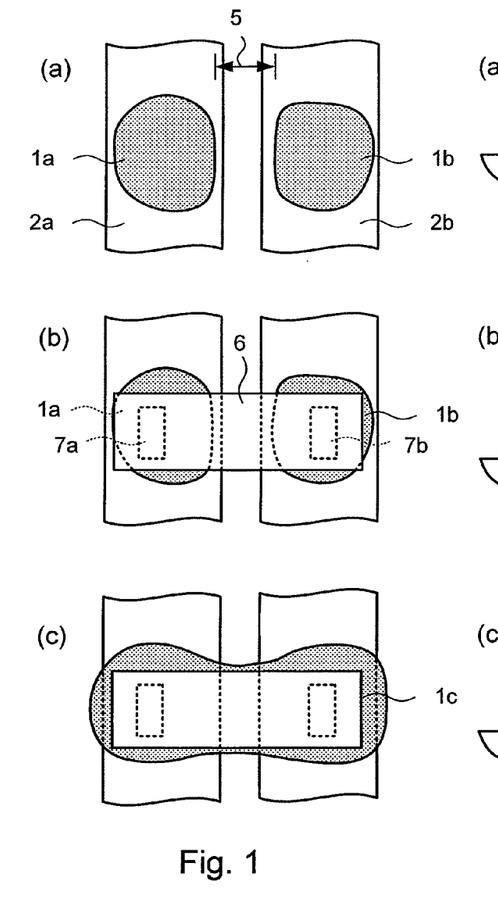
FIGS. 1 and 2 illustrate how two regions of conductive glue can be drawn together when mounting a device to on a substrate.
Figure 2:
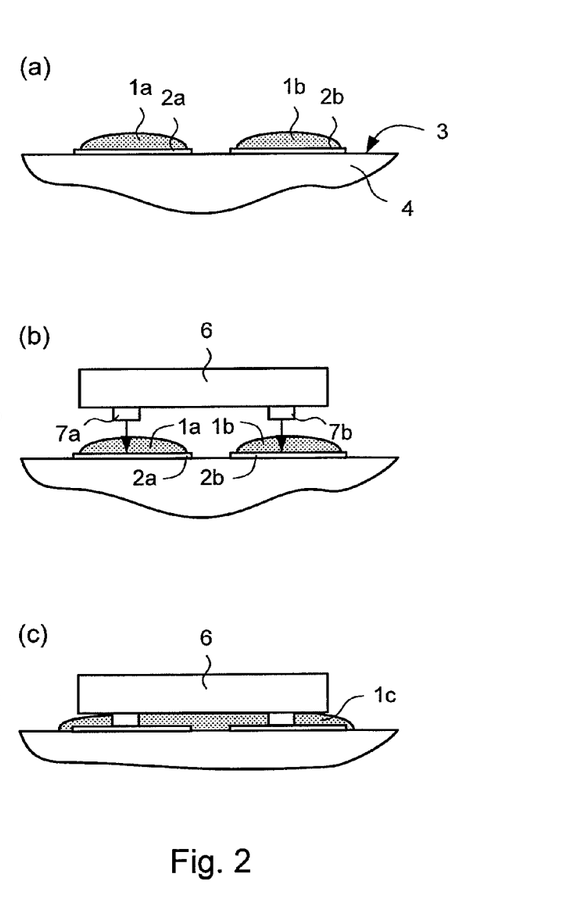

Referring to FIGS. 1a and 2a, first and second separate regions 1a, 1b of conductive glue are deposited on respective conductive tracks 2a, 2b running on an upper surface 3 of a substrate 4. The conductive glue regions 1a, 1b are closely separated by a gap 5 (e.g. about 1 mm) and contain, between them, sufficient excess glue for the glue to bridge the gap 5.

Referring to FIGS. 1b and 2b, an electronic device 6, such as a light emitting diode, having at least first and second terminals 7a, 7b is positioned over the conductive tracks 3a, 3b such that the device terminals 7a, 7b are aligned with the first and second regions 1a, 1b respectively and is lowered onto the conductive tracks 3a, 3b.

As the device 6 is lowered, it touches the top (i.e. the meniscus) of one or both of the conductive glue regions 1a, 1b. By capillary action, the regions 1a, 1b run together in a shallow space formed between the bottom of the device 6 and the top of the conductive tracks 2a, 2b and substrate 4.

As shown in FIGS. 1c and 2c, a joined region 1c is formed which electrically shorts the terminals 7a, 7b of the device 6.

It is noted that this problem does not tend affect conventional printed circuit boards because solder tends to adhere to copper tracks and does not flow onto the substrate.

The problem may be addressed by increasing the size of the gap 5, minimising the amount of the glue and/or using glue which is sufficiently viscous or reduces capillary action in some other way.

The present invention seeks to provide another solution this problem.

Figure 3:
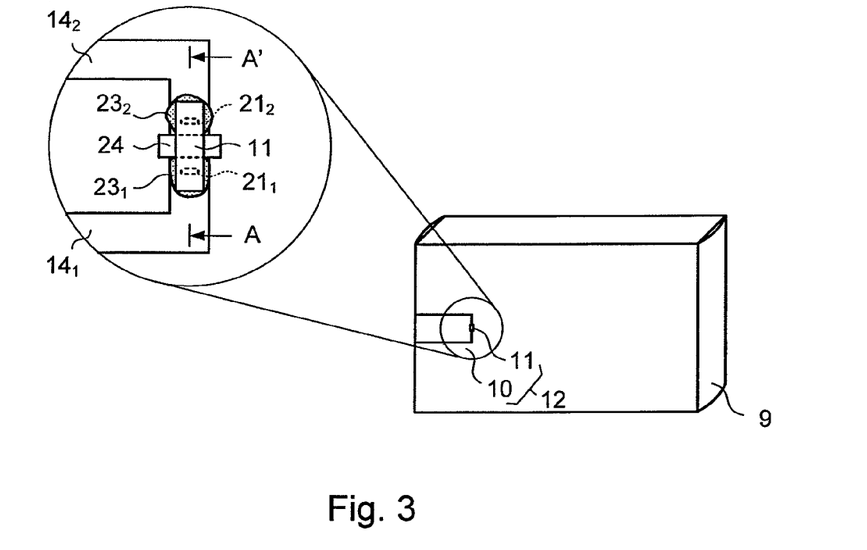
FIG. 3 is a perspective view of packaging providing a printed circuit board on which is mounted a device and which uses a slot in accordance with the present invention.

Referring to FIG. 3, packaging 9, in the form of a printed sheet of cardboard folded into the shape of a box, provides a printed circuit board 10 on which are mounted electrical devices 11 to provide circuitry 12 which can be used for entertaining a user, for providing information to the user or effecting some other user-directed function. For clarity, only part of the circuitry 12 is shown.

The packaging 9 may be a primary, secondary or tertiary form of packaging and may be used to package diverse forms of product such as foods (e.g. a cereal box), medicines (e.g. a box containing a blister pack of tablets or a tube of cream), household or office supplies, games and so on.

Electrical devices 11 may include discreet and integrated components and typically include a battery or other power source, such as a solar cell or inductive loop, and one or more other devices such as light emitting diodes, displays, speakers, buzzers, switches, sensors, transducers, integrated circuits and memory.

Figure 4:
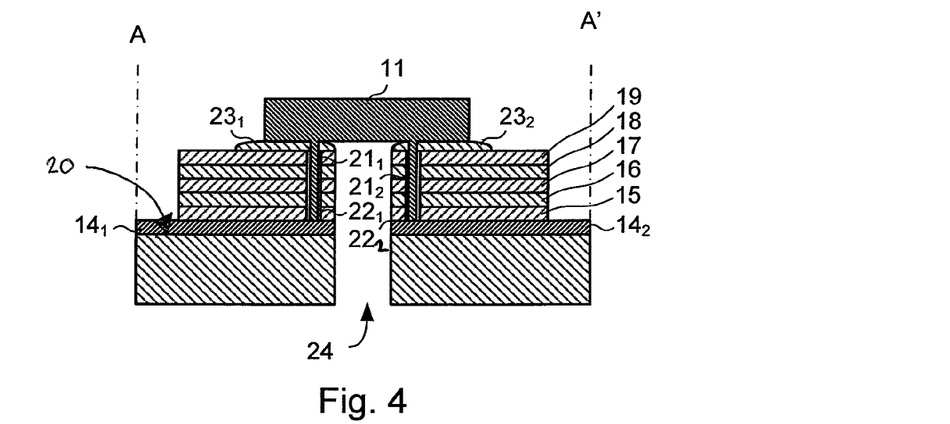
FIG. 4 is a cross-sectional view through the printed circuit board and the device taken along a line A-A' in FIG. 3.

Referring also to FIG. 4, the packaging 9 includes a sheet of cardboard (herein also referred to as a "substrate") supporting conductive tracks $14_1$, $14_2$ (herein the tracks $14_1$, $14_2$ collectively are sometimes referred to as the "circuit"), patterned layers of ink 15, 16, 17, 18 (herein also referred to as a "text and images") and, optionally, a top layer of a clear varnish 19.

The conductive tracks $14_1$, $14_2$ comprise a conductive ink, for example based on graphite, and typically have a thickness of the order of 1, 10 or 100 μm (usually dependent on the type of printing process used), a width of the order of 100 μm or 1 mm and a length of the orders of 1 mm to 1 m. The conductive tracks $14_1$, $14_2$ typically have a line spacing (e.g. minimum spacing between two lines running parallel to one another) of the order of 10 μm, 100 μm or 1 mm. The layers of ink 15, 16, 17, 18 comprise layers of cyan, yellow, magenta, black ink.

The printed circuit $14_1$, $14_2$ is formed under the text and images 15, 16, 17, 18. However, the printed circuit $14_1$, $14_2$ can be located between and/or on top of the layers of ink 15, 16, 17, 18 and varnish 19.

Packaging material other than cardboard may be used such card, a flexible plastic, such as polyethylene terephthalate ("PET") and polyimide, a flexible metallised plastic or a laminate of materials, e.g. card or paper between plastic.

As shown in FIG. 4, the printed circuit $14_1$, $14_2$ and the text and images 15, 16, 17, 18 are formed on a first side 20 (herein also referred to as a "face" or "surface") of the substrate 13. However, both sides of the substrate may be used.

An electronic device 11, in this example a light emitting diode, has terminals $21_1$, $21_2$ connected to respective conductive tracks $14_1$, $14_2$ through windows (or "vias") $22_1$, $22_2$ through the layers 15, 16, 17, 18, 19. The terminals $21_1$, $21_2$ are connected to the tracks $14_1$, $14_2$ using regions $23_1$, $23_2$ of conductive glue, for example comprising graphite or silver particles. The conductive glue 23 may also help to secure the device 11. The glue regions $23_1$, $23_2$ may be referred to as "spots", "blobs" or "patches".

A rectangular hole or slot 24 is provided between sections $25_1$, $25_2$, (in this case the ends) of the conductive tracks $14_1$, $14_2$ to which the terminals $21_1$, $21_2$ are connected. The slot 24 need not be rectangular, but may be elliptical or irregularly shaped. Furthermore, the slot 24 may trace a path, for example having one or more turns and which may include straight or curved sections.

Figure 8:
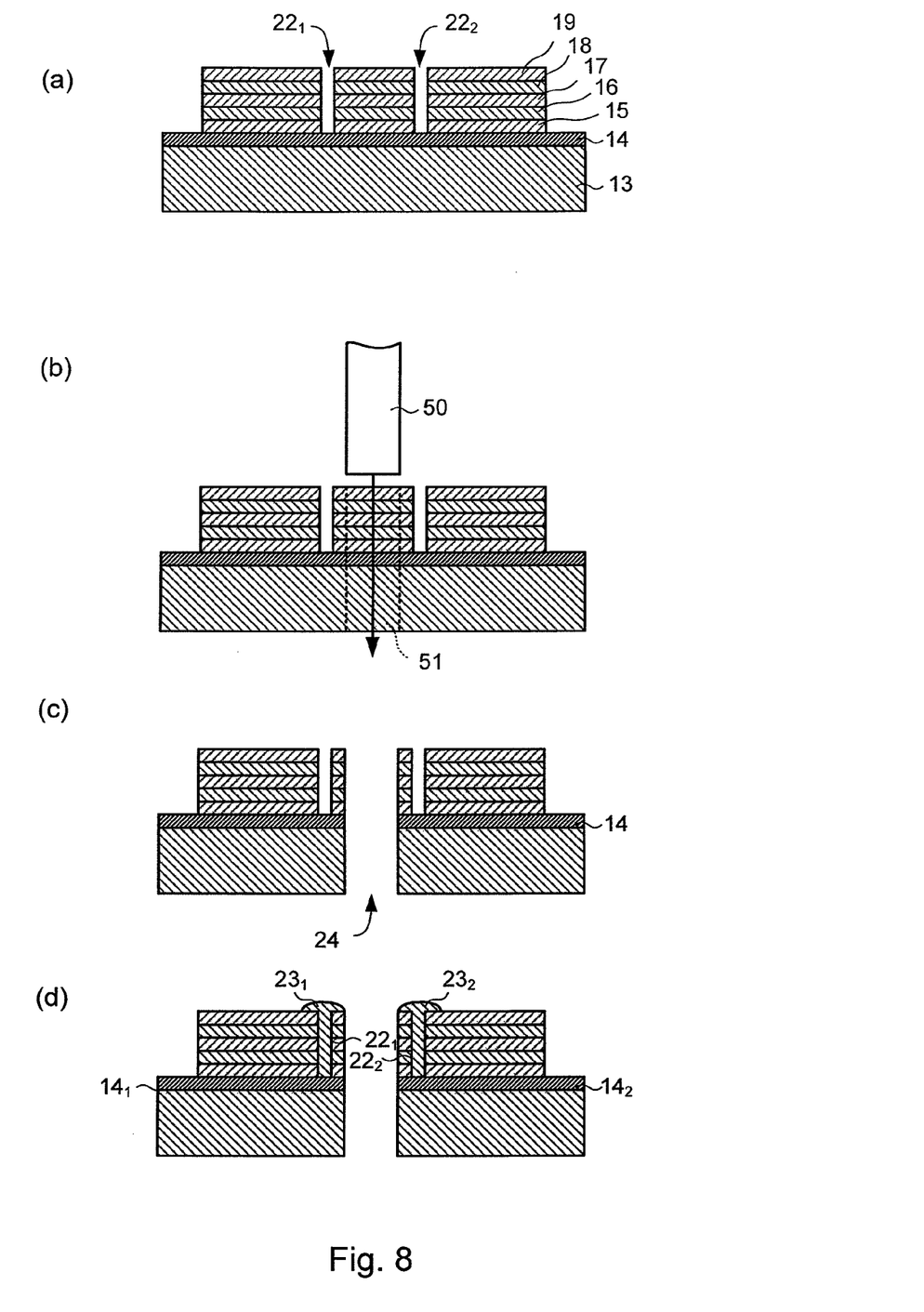
FIG. 8 illustrates a method of fabricating packaging in accordance with the present invention.

As will be explained in more detail later, the slot 24 is used to provide a physical barrier to prevent the conductive glue 23, when liquid or when more fluid, from spreading, particularly due to capillary action. In this and some other embodiments of the invention, the slot 24 also serves to define one or more edges of the conductive tracks $14_1$, $14_2$. Thus, a single line 14 (FIG. 8a) can be printed or formed and broken into two or more lines $14_1$, $14_2$ (FIG. 8c) using one or more slots 24.

Slots are positioned relative to the conductive tracks such that when glue is placed on the tracks ready for a device to be connected, the glue is located to one side of a slot and the slot separates the glue from another part of the circuit where a short should be avoided. Glue may be located immediately next to a slot or spaced some way away. Thus, the slots prevent glue from spreading over the surface of the substrate and/or over layers lying on the substrate 13 towards another track and/or another spot of glue.

Other forms of physical barrier can be used.

Figure 5:
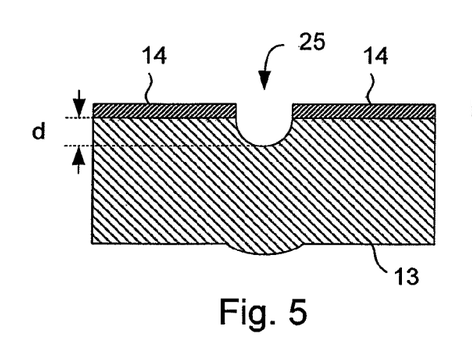
FIG. 5 is a cross-sectional view of packaging in which a trench is used instead of a slot.
Figure 6:
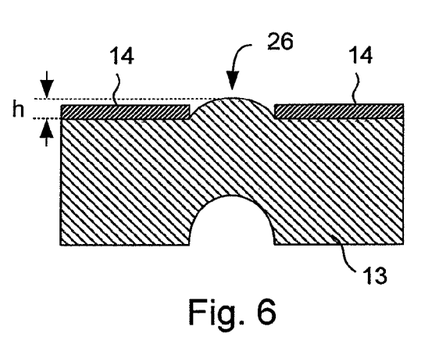
FIG. 6 is a cross-sectional view of packaging in which a wall is used instead of a slot.

Referring to FIGS. 5 and 6, the physical barrier may be a trench or trough 25 or a wall 26 used to separate tracks 14 on a substrate 13. The physical barrier may comprise a combination of trench(es) and wall(s). The trench 25 or wall 26 can be formed by stamping or scoring. It will be appreciated that a similar tool can be used for stamping and that the difference between punching a hole and simply deforming the substrate may lie in the sharpness of the tool and/or the force or range of movement of the tool.

The profile (in cross section) of the trench 25 or wall 26 may be vertical and/or in some way discontinuous so as to inhibit the spread of ink or to break up a spreading film of ink.

Additionally or alternatively, the depth (d) of the trench 25 or height (h) of the wall 26 is chosen such there is sufficient clearance to inhibit capillary action and/or such that a typical volume of ink (typically of the order of picoliters) cannot bridge trench 25 or wall 26. Values of depth and height can be found by routine experiment and typically exceed 100 μm.

Typically the physical barrier need only have a width of order of 100 μm, 1 mm or 10 mm, usually about 1 mm, and need only be effective while the glue is liquid or semi-liquid, typically for periods of the order of 0.1, 1 or 10 seconds.

Figures 7, 7A:
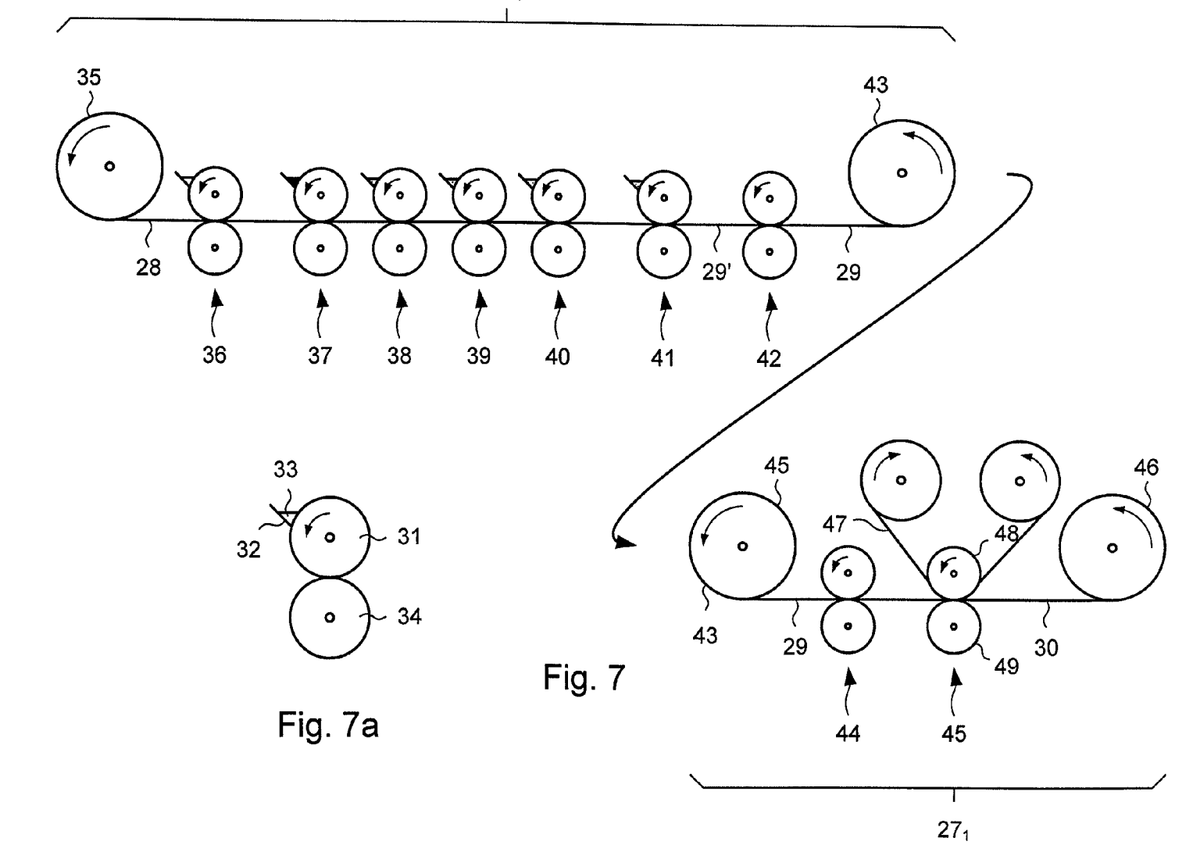
FIG. 7 is a schematic diagram of production line.

Referring to FIG. 7, apparatus 27 (or a "press") for manufacturing the packaging 9 (FIG. 3) generally comprises two parts $27_1$, $27_2$. A first part $27_1$ is used to take a sheet 28 of material, such as cardboard, and produce a printed sheet 29. A second part $27_2$ takes the printed sheet 29 and mounts devices 11 (FIG. 4) on the printed sheet 29 to form an assembled printed sheet 30.

The first and second parts $27_1$, $27_2$ may form parts of the same production line.

However, they may form different lines and be located at different sites or plants.

Referring also to FIG. 7a, the apparatus is based on a gravure printing process having several stages, each having a gravure cylinder 31, a doctor blade 32 and ink reservoir 33 and an opposing impression cylinder 34. However, other printing process can be used, such as offset, flexography, screen and inkjet printing processes and a mixture of different printing processes can be used in the same line.

In the first part $27_1$ of the apparatus, the (unprinted) sheet 28 of material is paid out from a roller 35 and passes through a printing stage 36 used to print conductive tracks on the sheet 29, through printing stages 37, 38, 39, 40 used to print cyan, yellow, magenta, black graphic layers and, optionally, through a stage 41 for printing a varnish layer. Fewer graphic printing stages 37, 38, 39, 40 may be used if, for example, a black-and-white or monochrome image is required.

A resulting sheet 29' passes through a cutting and creasing stage 42 used to crease the sheet 29' for allowing the sheet to be easily folded in the shape of a box and to cut the sheet 29' to form a web or matrix, ready to be divided into smaller parts, if necessary to form windows. The cutting and creasing stage 42 also forms the physical barriers, for example by stamping out holes in and/or between tracks, and/or by forming creases (troughs and/or wall) between tracks.

The printed sheet 29 is wound onto a take up roller 42 or fed directly into the second part $27_2$ of the apparatus.

In the second part $27_2$ of the apparatus, the printed sheet 29 passes through a gravure printing stage 44 used to print conductive glue on the sheet 29 and then passed through a device mounting stage 45 after which the assembled printed sheet 30 can be wound onto a take up roller 46.

The devices are provided on a web 47 and stamped out onto the sheet 29 using a patterned cylinder 48 and an impression roller 49. However, other processes can be used such as "pick-and-place" robots.

The whole press 27 or the second part of the press $27_2$ need not be a web press, but can be a sheet-fed press. For example, rather than using cylinders 48, 49 to cut and crease the sheet, boards can be used instead.

Referring to FIGS. 7 and 8, a method of fabricating the device will now be described.

Referring in particular to FIG. 8a, a conductive track layer 14 and ink layers 15, 16, 17, 18 and varnish 19 are deposited on the sheet 13. The ink layers 15, 16, 17, 18 and/or varnish 19 may be printed with windows $22_1$, $22_2$ onto the conductive track layer 14.

Referring in particular to FIG. 8b, a stamping tool 50 stamps out a portion 51 of the sheet 13 and the overlying layers 14, 15, 16, 17, 18, 19.

Referring in particular to FIG. 8c, stamping leaves a hole 24 which, in some embodiments, serves in part, to define, first and second conductive tracks $14_1$, $14_2$. However, holes need not be used to break a conductive track.

Referring in particular to FIG. 8d, spots of glue $23_1$, $23_2$ are applied into the windows $22_1$, $22_2$ which open onto the tracks $14_1$, $14_2$.

Referring to FIG. 8e, the device 11 is mounted during which the terminals $21_1$, $21_2$ are pressed into the windows $22_1$, $22_2$.

The slot 24 prevents a shallow channel 52 formed between an upper surface 53 of the top-most layer 19 and an under surface 54 of the device 11 extending between the terminals $21_1$, $21_2$.

The use of physical barriers, particularly slots, can be used with more complex devices having more than two terminals.

Figure 9:
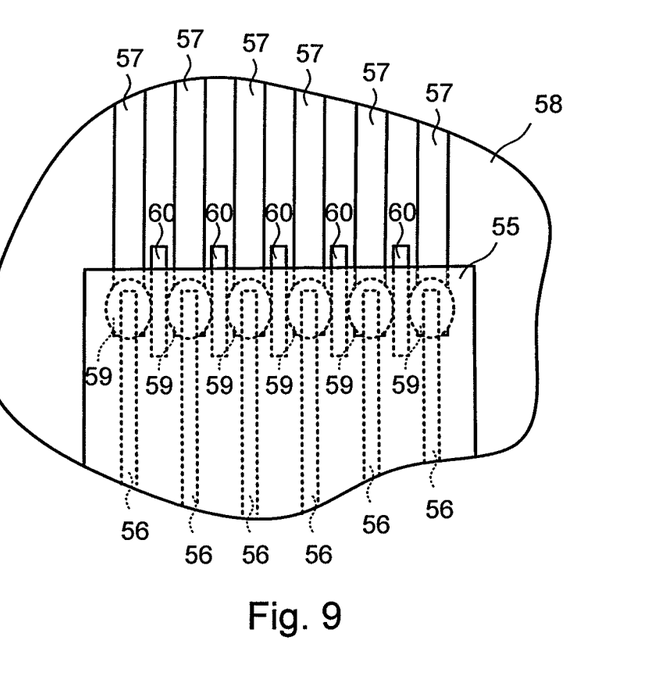
FIG. 9 is a plan view of a different type of device.

Referring to FIG. 9, a printed circuit board assembly 55 having more than two tracks 56 can be mounted onto corresponding tracks 57 of a printed sheet 58 using conductive glue 59. The printed sheet 58 has slots 60 punched out in regions between locations where glue is applied.

It will be appreciated that many modifications may be made to the embodiments hereinbefore described.

The use of physical barriers can be used printed sheets which are used to provide printed mater which need not necessarily be used as packaging. For example, the printed matter, for example in form of playing or trading card, can be used as a game or for information.

Instead of conductive ink, foil can be used to form the conductive tracks formed by (hot or cold) stamping or by masked etching of a metallised sheet.

A liquid, such as an ink, or semi-liquid, such as a paste may be used instead of glue.

The invention claimed is:

1. A method of fabricating packaging for a product and/or printed matter, the method comprising:
   forming a plurality of conductive tracks on a sheet of material by printing conductive ink on the sheet;
   forming a physical barrier for impeding fluid flow between adjacent conductive tracks by punching a hole through the sheet; and
   folding the sheet or a section of the sheet to form an enclosure.

2. A method according to claim 1, wherein the hole is elongate and has a longitudinal axis which is transverse to a shortest line between adjacent tracks.

3. A method according to claim 1, wherein forming the plurality of conductive tracks on the sheet of material includes forming at least one conductive track and breaking at least one conductive track into more conductive tracks.

4. A method according to claim 3, wherein forming the physical barrier punching the hole breaks the at least one conductive track into the more conductive tracks.

5. A method according to claim 1, further comprising:
   printing ink onto the sheet of material to form text and/or image(s).

6. A method according to claim 5, wherein printing the ink comprising:
   printing multiple inks to form colour text and/or image(s).

7. A method according to claim 1, further comprising: cutting the sheet into smaller sections.

8. A method according to claim 1, further comprising:
depositing first and second regions of conductive fluid onto first and second conductive adjacent tracks either side of the hole; and
mounting an electronic device having first and second terminals such that the electronic device forms a bridge over the hole and the first and second terminals contact the first and second conductive adjacent tracks.

9. A method of fabricating packaging for a product and/or printed matter, the method comprising:
forming a plurality of conductive tracks on a sheet of material by printing conductive ink on the sheet;
forming a physical barrier for impeding fluid flow between adjacent conductive tracks by punching a hole through the sheet;
mounting an electronic device to the sheet of material such that the electronic device forms a bridge over the hole; and
folding the sheet or a section of the sheet to form an enclosure.

* * * * *